United States Patent
Brosi et al.

(10) Patent No.: US 10,143,089 B2
(45) Date of Patent: Nov. 27, 2018

(54) PRINTING SYSTEM WITH FIRST AND SECOND PAIRS OF SLIDE ELEMENTS

(71) Applicant: EKRA AUTOMATISIERUNGSSYSTEME GmbH, Bonnigheim (DE)

(72) Inventors: Ralf Brosi, Grossbottwar (DE); Gerd Krause, Lochgau (DE); Klaus Mang, Blaubeuren (DE)

(73) Assignee: EKRA AUTOMATISIERUNGSSYSTEME GMBH, Bonnigheim (DE)

(*) Notice: Subject to any disclaimer, the term of this patent is extended or adjusted under 35 U.S.C. 154(b) by 412 days.

(21) Appl. No.: 14/813,388

(22) Filed: Jul. 30, 2015

(65) Prior Publication Data
US 2016/0037648 A1 Feb. 4, 2016

(30) Foreign Application Priority Data

Jul. 30, 2014 (DE) .................. 10 2014 215 022

(51) Int. Cl.
*H05K 13/00* (2006.01)
*H05K 3/10* (2006.01)
(Continued)

(52) U.S. Cl.
CPC .............. *H05K 3/10* (2013.01); *B23Q 1/262* (2013.01); *B23Q 1/48* (2013.01); *B41F 15/18* (2013.01);
(Continued)

(58) Field of Classification Search
CPC ........... B23Q 1/262; B23Q 1/48; B41F 15/18; H05K 13/0015; H05K 2203/0165; H05K 2203/166; H05K 3/10; H05K 3/1233
See application file for complete search history.

(56) References Cited

U.S. PATENT DOCUMENTS 5,988,060 A * 11/1999 Asai ................... H05K 3/1233
101/123
7,225,734 B2 * 6/2007 Schanz .................. B41F 15/16
101/127
(Continued)

FOREIGN PATENT DOCUMENTS

EP      2 711 183 A1    3/2014
GB        2497882 A     6/2013
JP      2004-034-639    2/2004

OTHER PUBLICATIONS

European Search Report from counterpart European application EP 15 17 8723, dated Feb. 19, 2016.

*Primary Examiner* — Minh Trinh
(74) *Attorney, Agent, or Firm* — Stephen T. Olson; Harness, Dickey & Pierce, P.L.C.

(57) ABSTRACT

A printing system for printing substrates, in particular printed circuit boards, includes a printing device having at least one printing table and a printing template assigned to the printing table. The printing system further includes a first pair of first slide elements and a second pair of second slide elements for aligning a substrate on the printing table. The first pair of first slide elements can be displaced counter to one another along a first axis. The second pair of second slide elements can be displaced counter to one another along a second axis, which differs from the first axis. A drive device is assigned to each pair for simultaneously displacing the slide elements thereof.

11 Claims, 2 Drawing Sheets

(51) Int. Cl.
    *B41F 15/18*    (2006.01)
    *H05K 3/12*     (2006.01)
    *B23Q 1/26*     (2006.01)
    *B23Q 1/48*     (2006.01)

(52) U.S. Cl.
    CPC ....... *H05K 3/1233* (2013.01); *H05K 13/0015* (2013.01); *H05K 2203/0165* (2013.01); *H05K 2203/166* (2013.01)

(56) References Cited

U.S. PATENT DOCUMENTS

| | | | | |
|---|---|---|---|---|
| 8,215,473 | B2* | 7/2012 | Baccini | H01L 21/67715 |
| | | | | 198/346.2 |
| 9,027,478 | B2* | 5/2015 | Murakami | B41F 15/14 |
| | | | | 101/129 |
| 2001/0032556 | A1* | 10/2001 | Ishida | B41F 15/0818 |
| | | | | 101/129 |
| 2013/0061766 | A1* | 3/2013 | Mizuno | B41F 15/0881 |
| | | | | 101/126 |
| 2013/0063709 | A1 | 3/2013 | Chen | |
| 2013/0269559 | A1* | 10/2013 | Murakami | B41F 15/14 |
| | | | | 101/481 |
| 2016/0037648 | A1* | 2/2016 | Brosi | B41F 15/18 |
| | | | | 29/559 |

* cited by examiner

PRINTING SYSTEM WITH FIRST AND SECOND PAIRS OF SLIDE ELEMENTS

CROSS-REFERENCE TO RELATED APPLICATIONS

This application claims priority to German Application No. 10 2014 215 022.1 filed 30 Jul. 2014. The entire disclosure of the above application is incorporated herein by reference.

The invention relates to a printing system for printing substrates, in particular printed circuit boards, comprising a printing device having at least one printing table and a printing template assigned to the printing table, and comprising means for aligning a substrate on the printing table.

The invention further relates to a method for operating the above-described printing system.

BACKGROUND

Modern printing system as commonly used for processing printed circuit boards, solar cells, films or the like work according to the principle that substrates are successively fed to a printing device via a feeding system and are aligned in the printing device with respect to a printing template, are printed and subsequently conveyed away. For the alignment it is known to provide cameras and image evaluation systems which optically detect the substrate in order to then be able, with the knowledge of the arrangement of the camera (s) with respect to the printing template, to optimally align the substrate with respect to the printing template. For this purpose it is known, for example, to move and/or rotate a printing table on which the substrate is placed for printing until the substrate is positioned congruent to the printing template. Only then a printing process is performed, for example by means of a scraper of the printing device, in which the printing medium is applied onto the substrate through the printing template, which can be a printing screen or a printing mask, for example.

Optically detecting the alignment of the substrate or the substrates offers very high accuracy and allows the processing of many different types and shapes of optical orientation tags and/or identification tags that are applied on the substrates. Once the printing process is completed, the substrate is removed again from the printing device and it is optionally inspected in advance or afterwards as to whether the printing process has been performed successfully. However, optically detecting the substrate or substrates has the disadvantage that optical orientation tags have to be applied on each of the substrates and optionally also on the printing template. Also, providing orientation tags on the substrates results in the act that no other elements such as circuit elements or the like can be provided in the region of the orientation tag(s), which can limit the utilization of the surface of the substrate during printing.

SUMMARY

It is an object of the invention to provide a printing system that overcomes the aforementioned disadvantages in a simple manner and enables a cost-effective and efficient alignment of substrates on a printing table.

The object underlying the invention is achieved by a printing system having the advantage that optical detection of the substrate can be omitted completely. Rather, it is provided that detecting and aligning the substrate is carried out mechanically. According to the invention it is provided for this purpose that the means have a first pair of first slide elements that can be displaced counter to one another along a first axis, and a second pair of second slide elements that can be displaced counter to one another along a second axis which differs from the first axis, wherein at least one drive device is assigned to each pair for simultaneously displacing the slide elements thereof. It is also provided that at least two times two slide elements are provided, wherein in each case two slide elements can be displaced counter to one another along an axis, and wherein the two axes differ from one another so that the slide elements of one pair move along one direction and the slide elements of the other pair move in another direction. This makes it possible to put a substrate between the slide elements when they are in their starting position and to clamp the substrate in each case between the slide elements of a pair when the pairs of slide elements move towards one another. Due to the fact that the slide elements of a pair are moved towards one another, the substrate is automatically aligned with respect to these slide elements. If first the first slide elements and subsequently the second slide elements are correspondingly moved towards one another, a clear alignment of the substrate on the printing table can thus be achieved. It is in particular required here that the outer contour of the substrate to be printed is known so that, for example, it can be determined as a function of the distance of the first slide elements and/or the second slide elements from one another if the substrate is placed correctly between the slide elements or if the correct substrate has been placed onto the printing table. Thus, a mechanical alignment and in particular a centering of the substrate or the substrates on the printing table is carried out by the printing system according to the invention in which a costly visual or optical detecting of orientation tags or the like can be omitted. As a result of the movement of the first slide elements as well as the second slide elements towards one another it is achieved that the substrate is aligned correctly and automatically. By displacing the printing table, it is subsequently also possible to preferably optimize the absolute position of the substrate with respect to the printing template. It is preferably provided that each of the slide elements can be displaced from a starting position towards the substrate.

The respective starting positions are selected such that when the slide elements are in their starting positions, a substrate can be placed between the slide elements or in the area between the slide elements on the printing table. The starting positions advantageously represent the position of the slide elements up to which the slide elements of a pair can be maximally moved apart from one another.

According to an advantageous refinement of the invention it is provided that the first and the second axes are aligned at least substantially perpendicular to one another. As a result, in particular a square and/or rectangular substrate is aligned in a simple manner by means of the printing system. The slide elements advantageously have such a width that they ensure secure engagement contact at the substrate. Each of the slide elements can have one or more contact points for the substrate. The contact points of a slide element advantageously lie in one plane. In the case that the substrate has a contour that deviates from a rectangle, it can also be provided that one or more of the contact points of a slide element lie in a second plane that deviates from the plane in order to allow optimal engagement contact and optimal alignment of the substrate with respect to the printing template.

Furthermore, it is preferably provided that the slide elements of the respective pair are mechanically coupled with one another to allow their displacement. Through mechanical coupling it is achieved that both slide elements of a pair can be displaced or moved towards one another by means of a single drive unit. Through mechanical coupling it is therefore possible to dispense with individual slide-element-specific driving devices and thereby to reduce cost and production expenditures. Mechanical coupling is preferably implemented through a spindle that is operatively connected to both slide elements of a pair and can be driven by an electric motor of the drive device. The rotation axis or longitudinal axis of the spindle preferably represents the first or second axis of the first or second pair of slide elements, respectively. If the drive devices of both pairs are each provided with one spindle for mechanically coupling the respective slide elements, the spindles are advantageously situated in different planes one above or below one another. The coupling is advantageously designed such that the slide elements are displaced counter to one another upon activation of the drive device.

According to an alternative embodiment of the invention it is provided that each slide is assigned its own activatable drive device. In this way, the slide elements can be activated or displaced individually. Through this, precision of the alignment can be increased. In particular, this makes it possible to bring the substrate in a desired position by displacing two slide elements of a pair in the same direction. Thus, electric coupling of the slide elements of a pair is provided in this embodiment.

Furthermore, it is preferably provided that each pair of slide elements is assigned at least one sensor for detecting the position of at least one of the slide elements. This has the advantage that the position of the slide elements is detected, and correct aligning can be verified as a function of the position. The sensor is preferably a current sensor which is assigned to the drive device and which monitors in particular the supply current of the electric motor. If the supply current increases abruptly, it can be concluded that the slide elements of the pair of slide elements driven by the electric motor have clamped the substrate between them and cannot be displaced any further. Thus, the end location or end position of the slide elements in which the substrate is securely clamped between the slide elements is detected. It is not absolutely necessary to determine an absolute position. If the sensor is configured for detecting the absolute position of the slide elements, the knowledge about the absolute position can be utilized, for example, to verify the size of the substrate through the distance between the slide elements of the pair, whereby operational reliability of the product equipment is further increased. It is in particular provided that the sensors are configured as position measuring sensors and form a position measuring system in order to determine the absolute end positions of the slide elements on the printing table. By knowing the absolute end positions, the printing table and/or the template can advantageously be aligned with respect to one another.

Furthermore, it is preferably provided that a control unit is provided which, for aligning the substrate, activates at least one of the pairs in such a manner that the slide elements of the pair are moved towards one another until the substrate is clamped between the slide elements. For this purpose, in particular the output signals of the sensor for detecting the end position of the slide elements are utilized, as described above. Once the substrate is clamped between all slide elements, it is assumed that the alignment of the substrate is carried out or has been completed.

Furthermore, it is preferably provided that the control unit first activates the first pair and subsequently the second pair of slide elements for sequentially aligning the substrate. By successively displacing the slide elements in pairs, it is achieved that the substrate is aligned sequentially, whereby conflicts during aligning are avoided.

Particularly preferably, it is provided that the slide elements are arranged to be retractable into the printing table. The sliding device with the first pair and the second pair of slide elements thus is arranged to be displaceable in height with respect to the printing table. In particular, it is provided that the slide elements, at least in their respective starting position, are movable in height with respect to the printing table. This makes it possible, in particular during the printing process, to remove the slide elements so that the printing template can be applied on the substrate. For this purpose, the printing table advantageously has a corresponding opening for each slide element, at least in the starting position of the slide elements, into which the slide element can be retracted. It can be provided that the opening extends from the starting position up to the middle of the printing table so that the respective slide element can be retracted into the printing table or lifted from printing table in each sliding position. It can also be provided that the opening is formed only in the region of the starting position and is large enough that only there the slide elements can be retracted. In this way, the slide elements in other sliding regions are supported from below by the printing table. In any case, it is preferably provided that the printing table has a recess along the respective axis, through which recess a portion of the respective slide element, in particular an actuating arm, extends for actuating the same so that the slide element can be connected, in particular below the printing table, to the respective spindle and/or the respective mechanical coupling or drive device.

Furthermore, it is preferably provided that the slide elements are arranged to be mounted rotatably. According to a first embodiment it is preferably provided that the slide elements are mounted to be freely rotatable so that they align themselves in their rotational position even during engagement contact with the substrate. As an alternative, it preferably provided that the slide elements can be rotated by motor in a controlled or variable manner in order to obtain a desired alignment of the substrate that deviates from a simple centered alignment, for example.

The method according to the invention for operating the printing system having the features of claim 10 is characterized in that the slide elements of the first pair are moved towards one another until the substrate is clamped between the first slide elements of the first pair, and that subsequently the second slide elements of the second pair are moved towards one another until the substrate is clamped between the second slide elements. This results in the advantages already mentioned above. Further features and advantages arise from the preceding description and from the claims.

BEST DESCRIPTION OF THE DRAWINGS

Hereinafter, the invention is to be explained in greater detail by means of an exemplary embodiment. In the figures.

DETAILED DESCRIPTION

Figure 1:
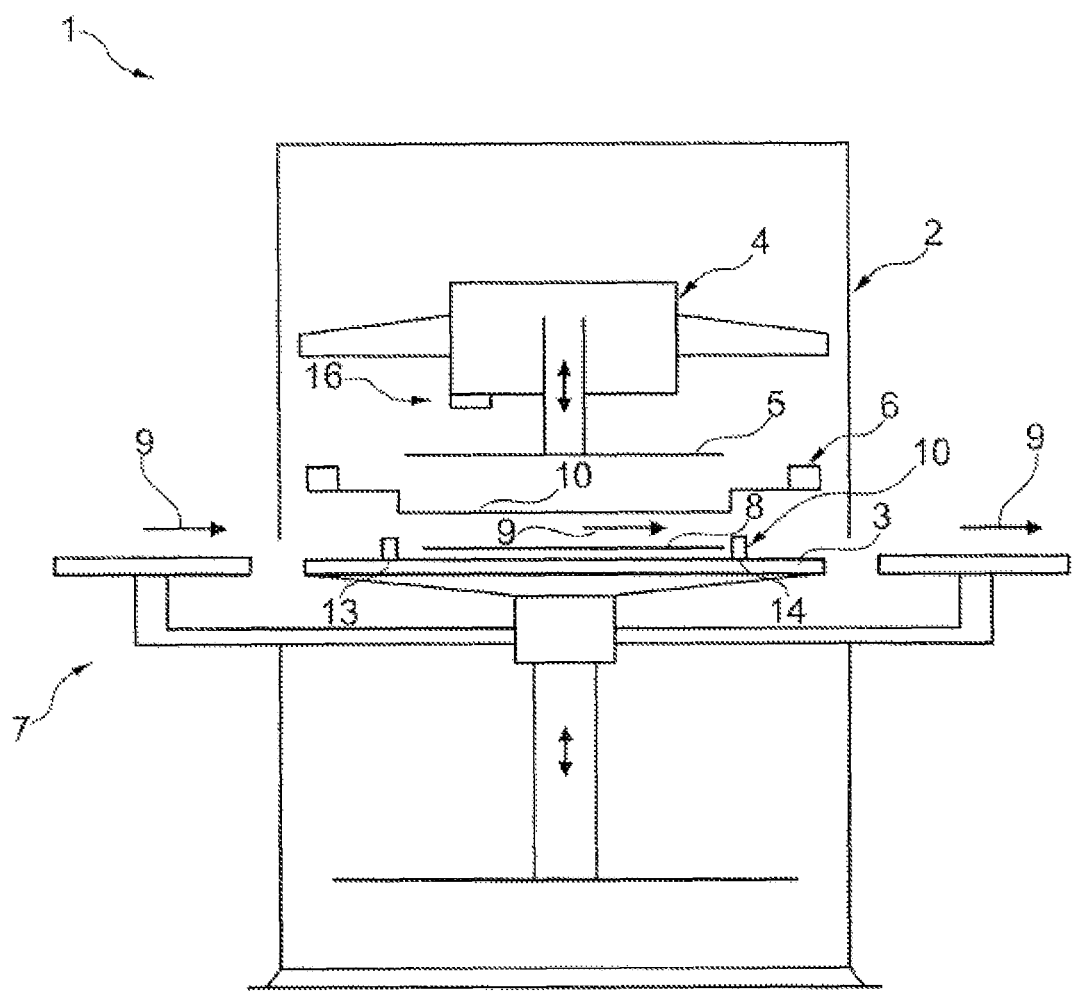
FIG. 1 shows a printing system in a simplified illustration.

FIG. 1 shows a simplified illustration of a printing system 1 for printing substrates such as printed circuit boards, ceramic plates, solar cells, films or the like. The printing system 1 has a printing device 2 that has a printing table 3 as well as a scraper device 4 with at least one movable scraper 5. The printing table 3 and the scraper 5 are in particular designed to be height-adjustable, as indicated by double arrows. The printing device 2 further includes a printing template 6 arranged between the scraper 5 and the printing table 3.

Furthermore, the printing device is assigned a transport device 7 that is designed to feed a substrate 8, which is illustrated here as an example, to the printing device 2, to transport it between the template 6 and the printing table 3 through the printing device and to convey it away again from the printing table 3, as indicated by arrows 9 which indicate the transport direction of the substrate 8 and/or the transport device 7.

Figure 2:
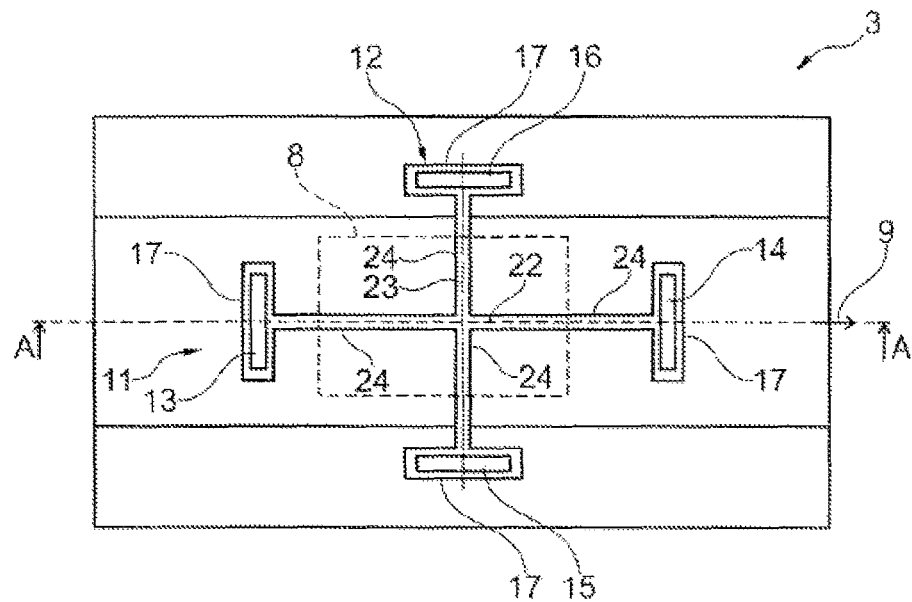
FIG. 2 shows a top view of a printing table of the printing system.
Figure 3:
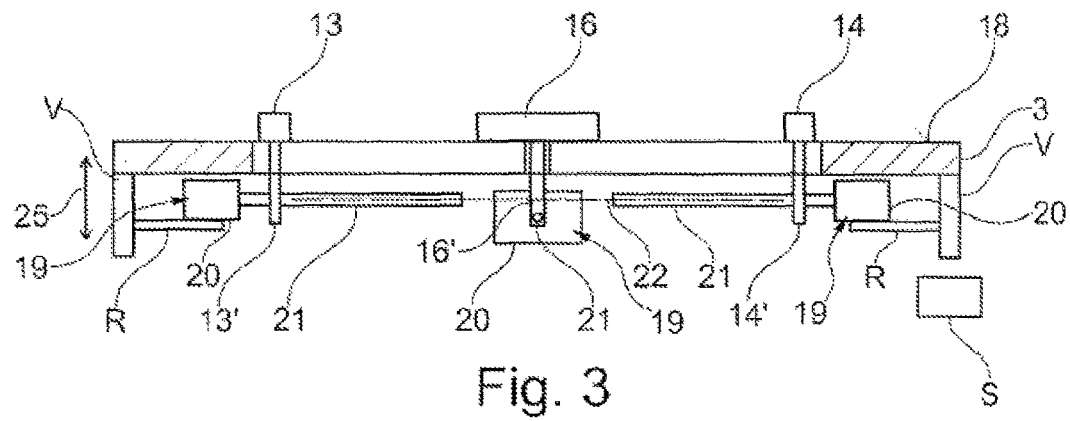
FIG. 3 shows a simplified sectional view of the printing table.

Means 10 for aligning the substrate on the printing table 3 in particular with respect to the printing template 6, which is to be explained hereinafter in greater detail by means of FIGS. 2 and 3, is assigned to the printing table 2.

FIG. 2 shows a top view of the printing table 3 of the printing system 1. Said means 10 has two pairs 11, 12 each with two slide elements 13, 14 and 15, 17, respectively. The slide elements 13, 14 of the pair 11 are arranged one behind the other in transport direction according to arrow 9. The slide elements 15, 16 of the second pair 12 are arranged between the slide elements 13, 14—viewed in transport direction 9—and opposite to one another. According to FIG. 2, the slide elements 13 to 16 are in a respective starting position on the printing table 3. The printing table 3 has a recess 17 for each slide element 13 to 16 in its starting position, which recess is formed to be at least as large as the respective slide element 13 to 16.

FIG. 3 shows a longitudinal sectional view of the printing table 3 along the line A-A of FIG. 2. The slide elements 13 to 16 protrude from the upper side 18 of the printing table 3. Each slide element 13 to 16 has an actuating arm 13', 16' and 14' that extends through the printing table 3 and/or the respective recess 17. Of course, the slide element 15 also has a corresponding actuating arm 15' which, however, cannot be seen in the illustration. Thus, the actuating arms 13', 14' and 16' extend through the printing table 3. On the lower side of the printing table 3, each of the slide elements 13 to 16 is provided in each case with one drive device 19, each of which has a an electric motor 20 and a spindle 21 that can be driven by the electric motor 20. The spindles 21 are arranged parallel to the upper side 18 of the printing table 3. The spindles 21 of each pair 11, 12 of slide elements 13, 14 and 15, 16, respectively, are aligned along a common rotation axis. The common axis forms an axis 22 and/or 23, along which the slide elements of a pair can be moved or displaced on the printing table 3. The rotation axes of the two pairs can be arranged at the same height or offset to one another, as shown in FIG. 3. The actuating arms 13', 16', 14' and 15' are operatively connected to the respective spindle 21 in such a manner that by means of a driving spindle 21, the respective slide element 13, 14, 15 and 16 is moved along the respective axis 22, 23 by the respective electric motor 20. For this purpose it is provided that guide slots 24 are provided in the printing table 3 which extend in each case from the recesses 17 and are aligned parallel to the respective axis 22, 23 and along which the respective actuating arm 13', 14', 16', (15') can be moved. In the present case it is provided that the guide slots 24 are formed narrower than the slide elements 13 to 16 so that the slide elements 13 to 16 slide with their lower side on the upper side 18 of the printing table 3 after they have left their starting position according to FIG. 2. For coordinated driving, the electric motors are assigned a common control unit S, which is only indicated here. The control unit S also monitors the current consumed by the respective electric motor 20 and in this respect serves as a current sensor, the function of which will be discussed in more detail later.

The slide units, composed in each case of a drive device 19 and a slide element 13 to 16, are advantageously displaceable perpendicular to the printing table 3, as indicated by a double arrow 25. It is in particular provided that the slide units are held on a common frame R which, for example, is arranged on the lower side of the printing table 3 and can be displaced perpendicular to the printing table 3 by a displacement device V. Through the design of the recesses 17 and the guide slots 24 it is provided in the present case that displacing the slide units is only possible when the slide elements 13 to 16 are situated in their starting position in the region of the recesses 17. It is in particular provided that the slide elements 17 are retracted so far into the printing table 3 that they are flush with the upper side 18 of the printing table 3.

During operation of the printing system 1, the substrate 3 is fed to the printing table 3, as already explained above. The slide elements, or at least the slide element 13, are arranged retracted into the printing table 3 so that the substrate 8 can be placed between the slide elements 13 to 16 on the printing table 3, as illustrated in FIG. 2 with dashed lines. As soon as the substrate 8 is situated between the slide elements 13 to 16, these slide elements or the one retracted slide element is lifted so that the slide elements 13 to 16 laterally protrude beyond the substrate 8. Subsequently, the control unit S activates the electric motors 20 of the drive device 19 in such a manner that first the slide elements 13, 14 of the pair 11 are pushed together until the slide elements 13, 14 rest against the substrate 8 so that the substrate is clamped between the slide elements 13, 14. The position of the slide elements 13, 14, in which the substrate 8 is clamped, is determined by monitoring the current of the electric motors 20 of the corresponding drive devices 19. If the current consumed by the respective electric motors 20 increases abruptly, this is understood as an indicator that the substrate 8 is clamped between the two slide elements 13, 14. If an increased current value is recorded for only one of the electric motors, this can have two reasons. It can be that only one of the slide elements 13 or 14 rests against the substrate 8 and moves or displaces the substrate in the direction of the opposing slide element 14, 13, or there is an error in the system because, for example, one of the slide elements 13, 14 is jammed and cannot be moved, regardless of the substrate 8. In this case, a warning is output. In order to be able to differentiate between the two situations, it is provided that the detected current value is compared with a threshold value so that only upon exceeding the predeterminable threshold value, it is concluded that there is an error in the system. If the current of both electric motors 20 increases abruptly, this current increase is also compared with the predeterminable threshold value and further activation of the electric motors is interrupted if the current consumption of the predeterminable threshold value is exceeded, which then indicates that the substrate 8 is clamped between the slide elements 13, 14.

Subsequently, the corresponding procedure is carried out with the slide elements 15, 16 by activating the respective electric motors 20. As a result, the substrate 8 is overall sequentially aligned on the printing table 3. Advantageously, the opposing slide elements 13, 14 and 15, 16, respectively, of the respective pair 11, 12 are moved simultaneously and uniformly towards one another until further movement is no longer possible. Alternatively or in addition to current monitoring by the control unit it is also conceivable to assign sensors to the slide elements, which sensors perform the monitoring of the movement of the slide elements 13 to 16 by means of a position measuring system.

As soon as it is determined that the slide elements 13 to 16 have reached their end position and that the substrate has been aligned accordingly, the slide elements 13 to 16 are withdrawn and/or moved away a bit from the substrate 8. In particular, the slide elements are moved back to their starting position and retracted into the printing table 3 by means of the displacement device V. Subsequently, the printing table 3 is moved towards the template or the template 6 is moved towards the printing table 3 to perform the previously described printing process.

Advantageously, the position of the slide elements 13 to 16 on the printing table in their end position is determined by a measuring system 26 comprising the position measuring sensors. This can be carried out as a function of the current monitoring and/or by optical sensors or the like. By knowing the position of the slide elements 13 to 16, the position of the substrate 8 on the printing table 3 is known as well. With this information, the printing template 6 is now aligned with the printing table 3 in that either the printing table 3 is aligned or the printing template 6 with the scraper 5 is aligned with the printing table 3. For this purpose, the printing table 3 on the one side and/or the printing template 6 and the scraper 5 on the other side are designed to be displaceable and/or pivotable in a plane parallel to the upper side 18 of the printing table 3 for positioning/aligning.

Thus, by mechanically aligning the substrate 8 by means of the means 10, on the one hand, the substrate 8 is aligned and, on the other hand, the position of the substrate 8 on the printing table 3 is verified or determined. In this way, a rapid and precise alignment of the substrate 8 with regard to the printing template 6 is carried out in simple and cost-effective manner, wherein this can be carried out regardless of size and shape of the substrate 8 to be printed.

As an alternative to the above-described exemplary embodiment it is provided according to another exemplary embodiment that instead of an electrical coupling of the slide elements 13 to 16 by activating the electric motors 20, a mechanical coupling of the slide elements 13, 14 and 15, 16, respectively, of the respective pair 11, 12 is provided. For this purpose, each of the slide elements 13, 14 and 15, 16, respectively, can interact with a common spindle 21. Other mechanical coupling possibilities or suitable gears are also conceivable. Through this, the number of electric motors 20 can be reduced and activating the means 10 can be simplified. As illustrated, the slide elements 13 to 16 can be formed as sliding plates or, alternatively, as sliding pins or centering pins. In particular, one pair 11 or 12 can have sliding plates as slide elements and the other pair 12 or 11 can have sliding pins.

The invention claimed is:

1. A printing system for printing substrates, the printing system comprising:
a printing device having at least one printing table and a printing template assigned to the printing table;
means for aligning a substrate on the printing table, including a first pair of first slide elements displaceable counter to one another along a first axis, and a second pair of second slide elements displaceable counter to one another along a second axis which differs from the first axis;
at least one drive device assigned to each of the first pair of slide elements and second pair of slide elements for simultaneously displacing the first slide elements and the second slide elements thereof;
wherein the first slide elements are mechanically coupled to one another so as to be displaceable counter to one another upon activation of the at least one drive device and the second slide elements are mechanically coupled to one another so as to be displaceable counter to one another upon activation of the at least one drive device.

2. The printing system according to claim 1, wherein the first and second axes are aligned perpendicular to one another.

3. The printing system according to claim 1, wherein the first and second axes are askew relative to one another.

4. The printing system according to claim 1, wherein each slide element is assigned in each case a separate activatable drive device.

5. The printing system according to claim 1, wherein each pair of slide elements is assigned at least one sensor for detecting a position of at least one of the slide elements of the first and second pairs.

6. The printing system according to claim 1, further comprising a control unit which activates the at least one drive device of at least one of the first and second pairs for aligning the substrate in such a manner that the slide elements of the first and second pairs are moved towards one another until the substrate is clamped between the slide elements.

7. The printing system according to claim 6, wherein the control unit first activates the first pair and subsequently the second pair of slide elements for sequentially aligning the substrate.

8. The printing system according to claim 1, wherein the slide elements are retractable into the printing table.

9. The printing system according to claim 1, wherein the slide elements are mounted rotatably.

10. A printing system for printing substrates, the printing system comprising:
a printing device having at least one printing table and a printing template assigned to the printing table;
means for aligning a substrate on the printing table, including a first pair of first slide elements displaceable counter to one another along a first axis, and a second pair of second slide elements displaceable counter to one another along a second axis which differs from the first axis;
at least one drive device assigned to each of the first pair of slide elements and second pair of slide elements for simultaneously displacing the first slide elements and the second slide elements thereof.

11. The printing system according to claim 10, wherein the control unit first activates the first pair and subsequently the second pair of slide elements for sequentially aligning the substrate.

* * * * *